United States Patent
Kim (10) Patent No.: US 9,923,519 B2
(45) Date of Patent: Mar. 20, 2018

(54) POWER AMPLIFIER AND PHASE CORRECTION METHOD THEREFOR

(71) Applicant: Samsung Electro-Mechanics Co., Ltd., Suwon-si (KR)

(72) Inventor: Gyu Suck Kim, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 14/992,490

(22) Filed: Jan. 11, 2016

(65) Prior Publication Data

US 2016/0268973 A1 Sep. 15, 2016

(30) Foreign Application Priority Data

Mar. 12, 2015 (KR) .................. 10-2015-0034230

(51) Int. Cl.
| | | |
|---|---|---|
| H03F 1/34 | (2006.01) | |
| H03F 1/02 | (2006.01) | |
| H03F 3/21 | (2006.01) | |
| H03F 1/56 | (2006.01) | |
| H03F 1/32 | (2006.01) | |
| H03F 3/191 | (2006.01) | |

(52) U.S. Cl.
CPC ......... *H03F 1/0205* (2013.01); *H03F 1/3223* (2013.01); *H03F 1/56* (2013.01); *H03F 3/191* (2013.01); *H03F 3/21* (2013.01); *H03F 2200/144* (2013.01); *H03F 2200/451* (2013.01); *H03F 2201/3236* (2013.01)

(58) Field of Classification Search
CPC ........................................................ H03F 1/34
USPC .................................................. 330/85, 151
See application file for complete search history.

(56) References Cited

U.S. PATENT DOCUMENTS

| | | | | |
|---|---|---|---|---|
| 3,378,781 | A * | 4/1968 | Hill .................. | H03F 1/302 330/110 |
| 3,493,869 | A * | 2/1970 | Van Dijkum ........... | H03D 7/12 330/112 |
| 3,600,698 | A * | 8/1971 | Neidig ................. | H03G 3/3005 330/278 |
| 3,665,345 | A * | 5/1972 | Dolby ................... | H03G 9/025 327/312 |
| 5,877,653 | A | 3/1999 | Kim et al. | |
| 6,091,296 | A * | 7/2000 | Rha ...................... | H03F 1/3223 330/149 |
| 6,253,070 | B1 * | 6/2001 | Andrews ................ | H03F 1/565 330/151 |
| 7,218,175 | B1 * | 5/2007 | Kobayashi ........... | H03F 1/0288 330/290 |
| 7,221,220 | B2 * | 5/2007 | Stein ..................... | H03F 3/68 330/126 |

(Continued)

FOREIGN PATENT DOCUMENTS

| | | |
|---|---|---|
| KR | 10-0217416 B1 | 9/1999 |
| KR | 10-2004-0017167 A | 2/2004 |
| KR | 10-2008-0087634 A | 10/2008 |

*Primary Examiner* — Henry Choe
(74) *Attorney, Agent, or Firm* — NSIP Law (57) ABSTRACT

A power amplifier apparatus may include an amplifier configured to amplify an input signal and a delay transferring circuit connected between an input terminal and an output terminal of the amplifier, the delay transferring circuit configured to delay the input signal to transfer the delayed input signal to the output terminal of the amplifier.

17 Claims, 10 Drawing Sheets

(56) References Cited

U.S. PATENT DOCUMENTS

| | | | | |
|---|---|---|---|---|
| 7,956,683 | B2* | 6/2011 | Lejon | H03F 1/0205 |
| | | | | 330/136 |
| 8,890,620 | B2* | 11/2014 | Tamanoi | H03F 1/56 |
| | | | | 330/124 R |
| 2004/0198271 | A1* | 10/2004 | Kang | H03F 1/086 |
| | | | | 455/127.1 |
| 2012/0249234 | A1* | 10/2012 | Robert | H03F 1/34 |
| | | | | 330/85 |

* cited by examiner

POWER AMPLIFIER AND PHASE CORRECTION METHOD THEREFOR

CROSS-REFERENCE TO RELATED APPLICATION(S)

This application claims the benefit of Korean Patent Application No. 10-2015-0034230 filed on Mar. 12, 2015 in the Korean Intellectual Property Office, the entire disclosure of which is incorporated herein by reference for all purposes.

BACKGROUND

1. Field

The present disclosure relates to a power amplifier and a phase correction method for a power amplifier.

2. Description of Related Art

Recently, there has been rapid progress in wireless transmission and reception systems, and a system having high linearity characteristics has been gradually required in accordance with the demand for a more accurate and high data transmission rate. In accordance with the above-mentioned demand, linearity characteristics of a power amplifier (PA), an amplifier of a final amplifying stage processing a large signal in the wireless transmission and reception system, has become increasingly important.

In addition, the power amplifier is generally a necessary part of a transmitter, and accounts for a disproportionately large part of the power consumption of the overall system as well as a role of the transmitter. That is, in order to improve efficiency characteristics of the overall system, there is a need to improve efficiency characteristics of the power amplifier.

Therefore, in order for the power amplifier to transmit a signal which is substantially undistorted in a wireless transmission and reception stage with a low degree of energy, a solution to improve linearity characteristics and power efficiency characteristics of the power amplifier may be beneficial.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a power amplifier apparatus includes an amplifier configured to amplify an input signal; and a delay transferring circuit connected between an input terminal and an output terminal of the amplifier. The delay transferring circuit is configured to delay the input signal to transfer the delayed input signal to the output terminal of the amplifier.

The delay transferring circuit may be configured to delay the input signal such that an offset ratio of a secondary harmonic component of the signal amplified by the amplifier is higher than an offset ratio of a fundamental wave component of the signal amplified by the amplifier.

The delay transferring circuit may include a transistor having two terminals connected to the input terminal of the amplifier and one terminal connected to the output terminal of the amplifier to transfer a harmonic signal component of the input signal to the output terminal of the amplifier from the input terminal of the amplifier.

The delay transferring circuit may include a resistor connected between the input terminal and the output terminal of the amplifier and having a resistance level determined based on a delay component between the input terminal and the output terminal of the amplifier.

The delay transferring circuit may include a capacitor connected between the input terminal and the output terminal of the amplifier and having capacitance determined based on a resistance level between the input terminal and the output terminal of the amplifier.

The power amplifier apparatus may further include a first matching network matching impedance of the input terminal of the amplifier; and a second matching network matching impedance of the output terminal of the amplifier, wherein the capacitance of the capacitor is adaptively established based on the impedance of at least one of the first matching network or the second matching network, or combinations thereof.

The delay transferring circuit may be configured to delay the input signal such that a time difference between a delay time of a fundamental wave component of the input signal is different from a delay time of a secondary harmonic component of the input signal.

According to another general aspect, a power amplifier apparatus includes an amplifier configured to amplify an input signal and a harmonic wave transferring circuit connected between an input terminal and an output terminal of the amplifier. The harmonic wave transferring circuit is configured to transfer a harmonic component of the input signal to the output terminal of the amplifier.

The harmonic wave transferring circuit may have an impedance adaptively established such that a transfer ratio of a secondary harmonic wave of the input signal is higher than a transfer ratio of a fundamental wave of the input signal when the input signal is transferred to the output terminal of the amplifier.

The power amplifier apparatus may further include a diode connected between the input terminal and the output terminal of the amplifier which transfers the input signal of the amplifier to the output terminal from the input terminal of the amplifier.

According to another general aspect, a method for reducing distortion in an amplified signal includes providing an input signal to an amplifier to generate an amplified signal and adaptively generating interference between at least a portion of the amplified signal and at least a portion of the input signal to reduce distortion in a mixed output signal. The output signal includes both the input signal and the amplified signal.

The method may further include detecting an operational parameter of at least one of the input signal, the amplified signal, or the output signal, or combinations thereof.

The adaptively generating interference may be performed responsive to the detection of the operational parameter.

The mixing of the input signal and the amplified signal may be performed via a feed-forward path substantially omitting amplification of the input signal.

At least one of the input signal and the amplified signal, or combinations thereof, may be selectively delayed.

At least one harmonic frequency of the input signal may be mixed with a portion of the amplified signal in a constructive manner to correct phase of the amplified signal via a feedforward path substantially omitting amplification of the input signal.

The adaptively generating interference may include delaying the input signal such that an offset ratio of a secondary harmonic component of the amplified signal is higher than an offset ratio of a fundamental wave component of the amplified signal.

The adaptively generating interference may include selectively mixing a harmonic signal component of the input signal with the amplified signal to form the output signal.

The adaptively generating interference may include delaying the input signal such that a time difference between a delay time of a fundamental wave component of the input signal is different from a delay time of a secondary harmonic component of the input signal.

An impedance may be adaptively established such that a transfer ratio of a secondary harmonic wave of the input signal is higher than a transfer ratio of a fundamental wave of the input signal when the input signal is mixed with the amplified signal to form the output signal.

Other features and aspects will be apparent from the following detailed description, the drawings, and the claims.

BRIEF DESCRIPTION OF THE DRAWINGS

The above and other aspects, features and advantages of the present disclosure will be more clearly understood from the following detailed description taken in conjunction with the accompanying drawings, in which.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
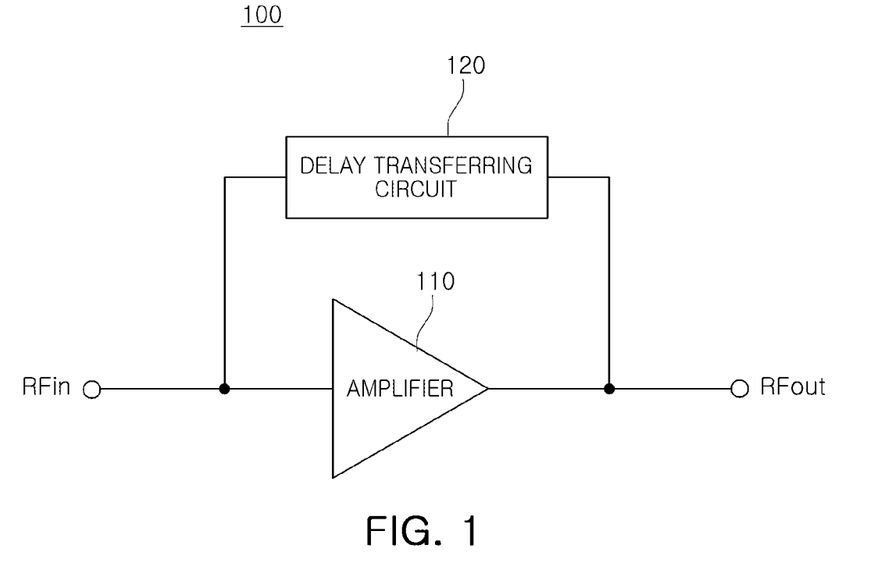
FIG. 1 is a drawing illustrating an exemplary power amplifier according to an embodiment in the present disclosure.

FIG. 1 is a drawing illustrating an exemplary power amplifier.

Referring to FIG. 1, the power amplifier 100 includes an amplifier 110 and a delay transferring circuit 120.

The amplifier 110 amplifies an input signal. Here, the input signal may be input through an input terminal RFin. The signal amplified by the amplifier 110 may be output through an output terminal RFout. For example, the output terminal RFout may be connected to an antenna (not illustrated).

For example, the amplifier 110 may include an active element such as a semiconductor device. In general, distortion of phase characteristics between input and output signals may occur during a process of amplifying the active element. For instance, the input signal may be amplified while passing between a point A and a point C, and non-linearity characteristics may occur due to a change in a parasitic component of the active element while power of the input signal is increased. As a result, magnitude and phase information of the input signal may be gradually distorted.

The delay transferring circuit 120 may be connected between an input terminal and an output terminal of the amplifier 110 to delay the input signal and may transfer the delayed input signal to the output terminal of the amplifier 110. For instance, the delay transferring circuit 120 may reduce the distortion of phase characteristics between the input and output signals, which occur during an amplification process of the amplifier 110. As a result, linearity characteristics of the power amplifier 100 may be improved.

For example, the delay transferring circuit 120 may delay the input signal so that an offset ratio of a secondary harmonic component of the signal amplified by the amplifier 110 is higher than that of a fundamental wave component of the signal amplified by the amplifier 110. For instance, the delay transferring circuit 120 may control phases for the fundamental wave component and the secondary harmonic component, respectively, to improve efficiency characteristics and linearity characteristics of the power amplifier 100.

Figure 2:
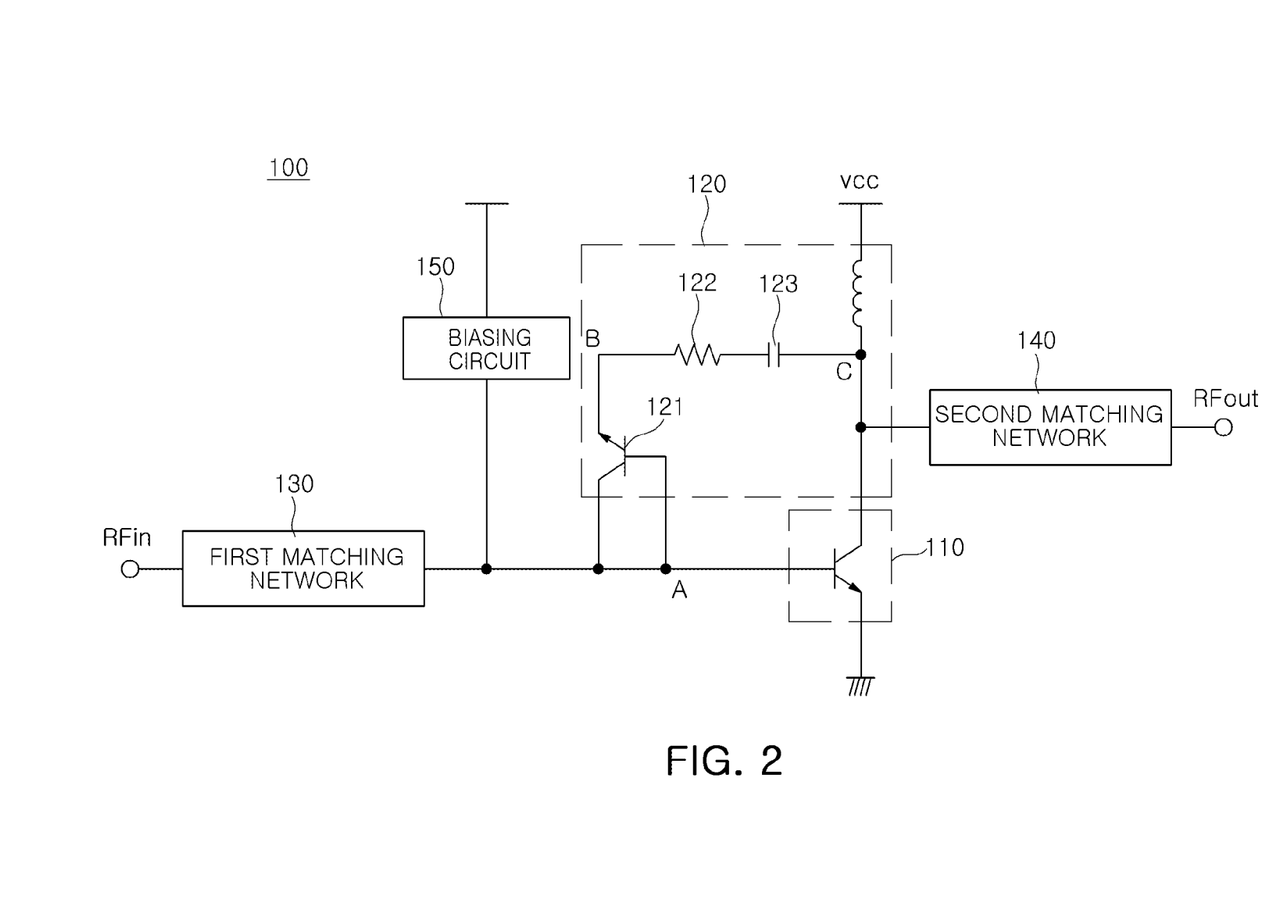
FIG. 2 is a circuit diagram illustrating the power amplifier of FIG. 1.

FIG. 2 is a circuit diagram illustrating the power amplifier of FIG. 1.

Referring to FIG. 2, the delay transferring circuit 120 may include a transistor 121, a resistor 122, and a capacitor 123.

The transistor 121 may have two terminals connected to the input terminal of the amplifier 110 and one terminal connected to the output terminal of the amplifier 110 to transfer a harmonic signal component of the input signal to the output terminal from the input terminal.

For example, when the transistor 121 is a bipolar junction transistor, a collector terminal and a base terminal of the transistor 121 may be connected to the input terminal of the amplifier 110, and an emitter terminal of the transistor 121 may be connected to the output terminal of the amplifier 110. As a result, the transistor 121 may serve as a diode.

Meanwhile, the transistor 121 may be implemented as a transistor of which a base terminal and a collector terminal are connected to each other. The transistor 121 may also be implemented as a field effect transistor of which a gate terminal and a drain terminal are connected to each other, and may also be implemented as a diode formed by a single p-n junction. Therefore, the transistor 121 does not necessarily need to be formed of three terminals.

Here, since the transistor 121 is a kind of active element, the input signal passing through the transistor 121 may include the harmonic signal component. The harmonic signal component transferred by the transistor 121 may offset a harmonic signal component of the signal amplified by the amplifier 110. Here, the offset of the harmonic signal components may be controlled by a delay by the resistor 122, the capacitor 123, and the like.

The resistor 122 may be connected between the input terminal and the output terminal of the amplifier 110 to have a resistance level determined based on a delay component between the input terminal and the output terminal of the amplifier 110.

The capacitor 123 may be connected between the input terminal and the output terminal of the amplifier 110 to have capacitance determined based on a resistance level between the input terminal and the output terminal of the amplifier 110.

Here, the capacitor 123 may be a kind of delay element capable of delaying a phase by 90°. The phase delayed by the capacitor 123 may be determined depending on a relative difference of the capacitance of the capacitor 123 and the resistance level of the resistor 122. For example, in a case in which the capacitance of the capacitor 123 is significantly larger than the resistance level of the resistor 122, a delayed phase of the signal by the capacitor 123 may be close to 90°. For example, in a case in which the capacitance of the capacitor 123 is similar to the resistance level of the resistor 122, the delayed phase of the signal by the capacitor 123 may be close to 45°.

Referring to FIG. 2, the power amplifier 100 may further include a first matching network 130, a second matching network 140, and a biasing circuit 150.

The first matching network 130 may match impedance of the input terminal of the amplifier 110.

The second matching network 140 may match impedance of the output terminal of the amplifier 110.

For example, the first matching network 130 and the second matching network 140 may include a matching capacitor and a matching inductor to have impedance of about 50Ω. Here, capacitance of the matching capacitor and inductance of the matching inductor may be determined depending on a frequency of the input signal.

Meanwhile, the capacitance of the capacitor 123 may be determined based on the impedance of the first matching network 130 or the second matching network 140.

The biasing circuit 150 may provide a current to the amplifier 110 to bias the amplifier 110. Here, the biasing means that a current or voltage of a specific value is provided so that a bias current flows in a specific block or an element or a bias voltage is applied to the specific block or the element.

Hereinafter, a power amplifier 200 according to an embodiment will be described. A description that is the same as or corresponds to the description of the power amplifier 100 described above with reference to FIGS. 1 and 2 will be omitted for clarity and conciseness.

Figure 3:
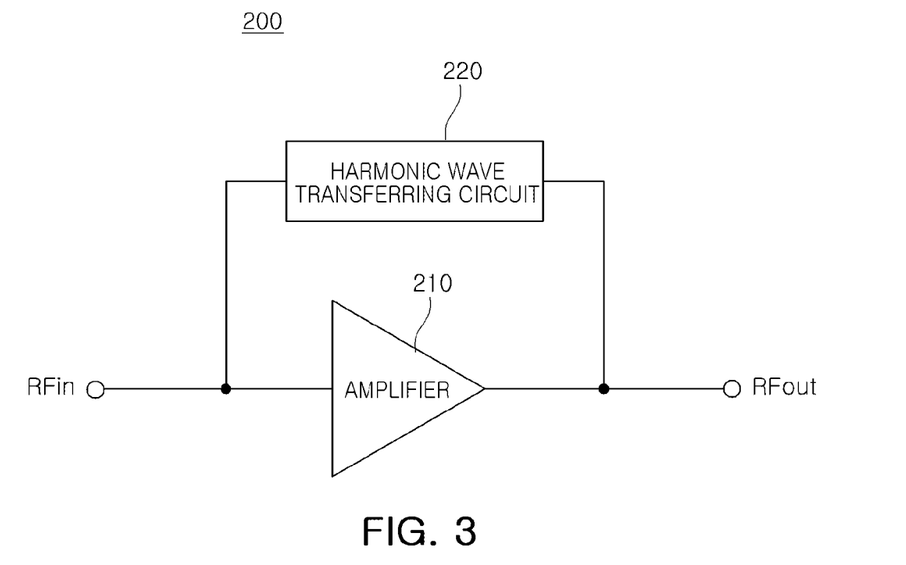
FIG. 3 is a drawing illustrating a power amplifier.

FIG. 3 is a drawing illustrating an example power amplifier according to an embodiment.

Referring to FIG. 3, the power amplifier 200 may include an amplifier 210 and a harmonic wave transferring circuit 220.

The amplifier 210 amplifies an input signal. Here, the input signal may be input through an input terminal RFin. The signal amplified by the amplifier 210 is output through an output terminal RFout. For example, the output terminal RFout may be connected to an antenna (not illustrated).

The harmonic wave transferring circuit 220 may be connected between an input terminal and an output terminal of the amplifier 210 and may transfer a harmonic component of the input signal to the output terminal of the amplifying circuit 210. For instance, the harmonic wave transferring circuit 220 may offset a harmonic wave occurring at the output terminal during an amplification process of the amplifier 210. As a result, linearity characteristics of the power amplifier 200 may be improved.

For example, the harmonic wave transferring circuit 220 may have impedance adaptive set so that a transfer ratio of a secondary harmonic wave when the input signal is transferred to the output terminal is higher than that of a fundamental wave. For instance, the harmonic wave transferring circuit 220 may offset the secondary harmonic wave at the output terminal by transferring a secondary harmonic component of the input signal larger than a fundamental wave component of the input signal. As a result, linearity characteristics and efficiency characteristics of the power amplifier 200 may be simultaneously improved.

Figure 4:
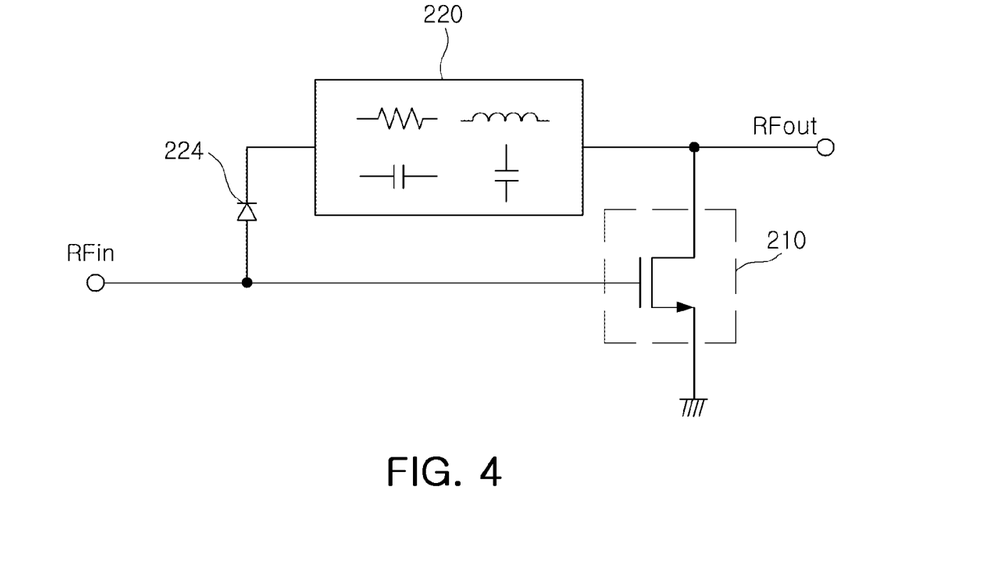
FIG. 4 is a circuit diagram illustrating the power amplifier of FIG. 3.

FIG. 4 is a circuit diagram illustrating the power amplifier of FIG. 3.

Referring to FIG. 4, the harmonic wave transferring circuit 220 includes a diode 224 connected between the input terminal and the output terminal of the amplifier 210 to transfer the input signal to the output terminal from the input terminal.

In addition, the harmonic wave transferring circuit 220 may include a resistor, a capacitor, an inductor, a parasitic element, and the like, and may have specific impedance.

Figure 5A:
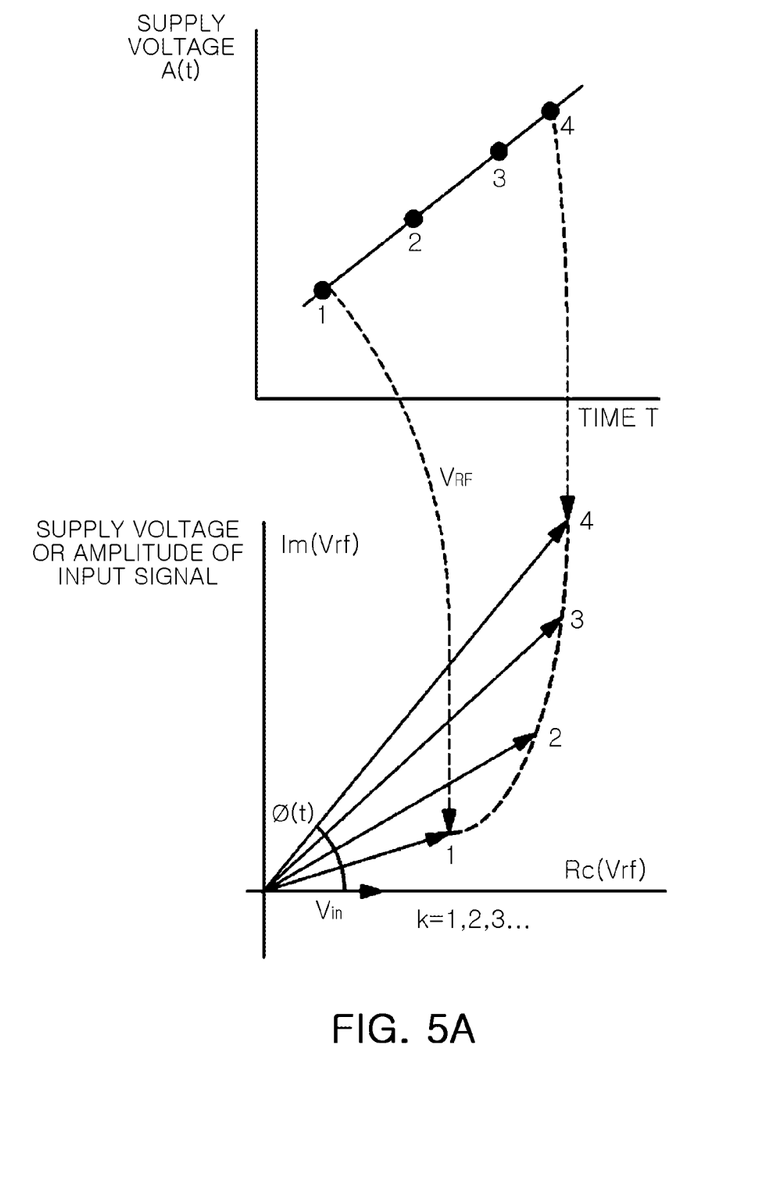
FIGS. 5A and 5B are views illustrating a phase in an example power amplifier.
Figure 5B:
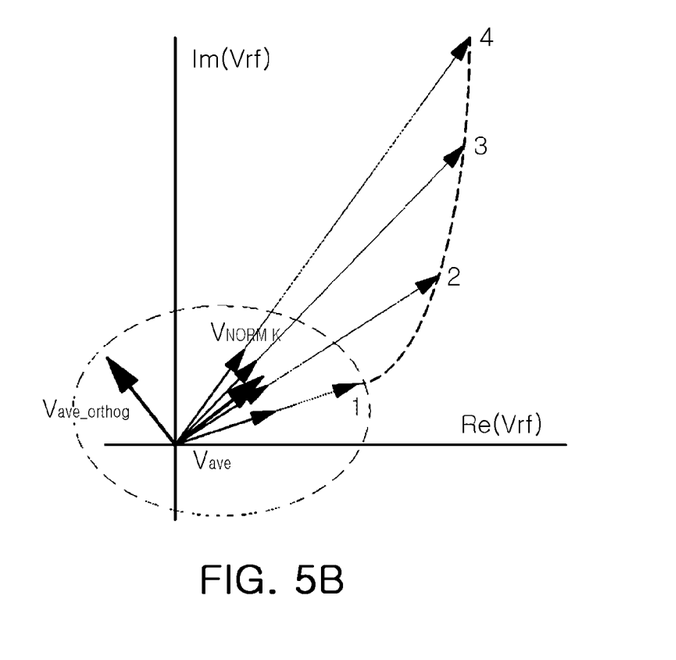

FIGS. 5A and 5B are views illustrating a phase in a power amplifier.

Referring to FIG. 5A, FIG. 5A illustrates a distortion of a phase which may occur at an output terminal of the power amplifier when a supply voltage is linearly changed over time in the power amplifier. Thereby, a relationship between a power supply voltage and an operation frequency signal at the output terminal of the power amplifier may be seen. As non-linear characteristics are present between the supply voltage and a phase of the amplified signal, a possibility that phase error occurs at the output terminal of the power amplifier and an error occurs in a signal transfer may be increased.

Referring to FIG. 5B, FIG. 5B illustrates phase angles depending on phase distortions. For example, amplitudes of output signals Vnorm k amplified at the output terminal of the power amplifier are normalized, and thus an average Vave of the respective normalized signals may be calculated. In addition, an orthogonal vector Vave_orthog of an average vector may be calculated, and scalar values (projection value) in proportion to phase errors of the output signals for the orthogonal vectors of the respective normalized signals may be calculated. In addition, a phase correction angle may be determined using the scalar values and the phase error of the output terminal may be corrected by adding a phase correction signal to the output signal using the phase correction angle.

For example, the delay transferring circuit or the harmonic wave transferring circuit included in the power amplifier according to the embodiment may correct the phase by the process described above. As a result, transmission characteristics of the power amplifier may be effectively stabilized.

Figure 6A:
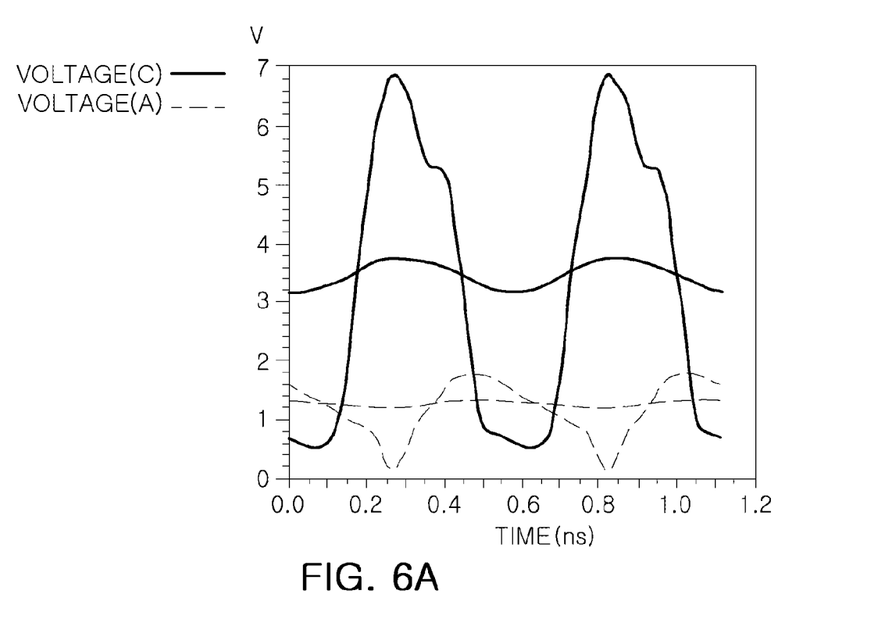
FIGS. 6A and 6B are graphs illustrating a transition of a voltage and a current of an amplifying circuit over time in a power amplifier which does not include a delay transferring circuit.
Figure 6B:
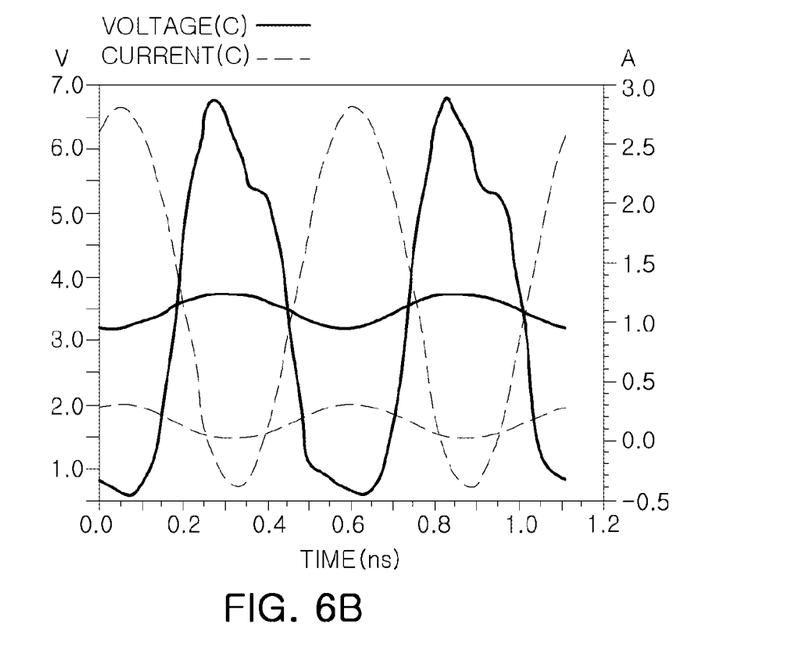

FIGS. 6A and 6B are graphs illustrating a transition of a voltage and a current of an amplifier over time in a power amplifier which does not include a delay transferring circuit.

Figure 7A:
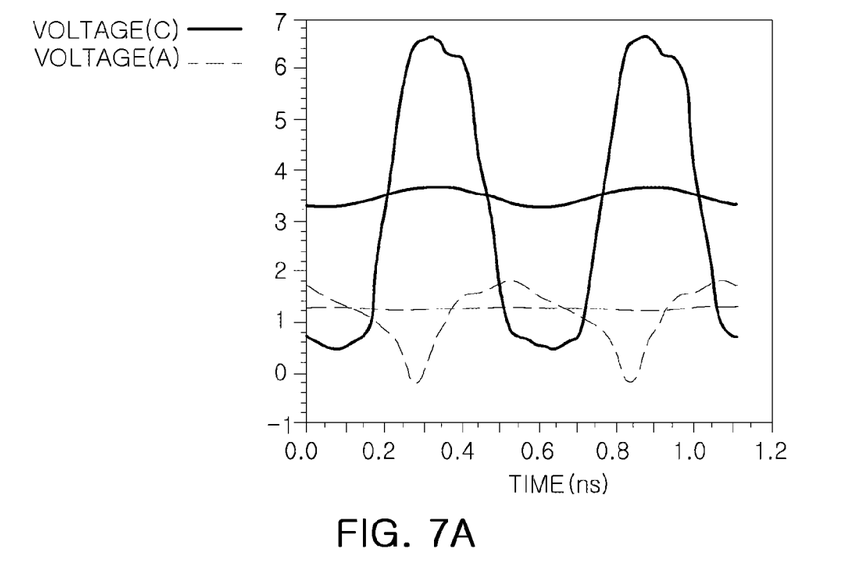
FIGS. 7A and 7B are graphs illustrating a transition of a voltage and a current of an amplifying circuit over time in a power amplifier.
Figure 7B:
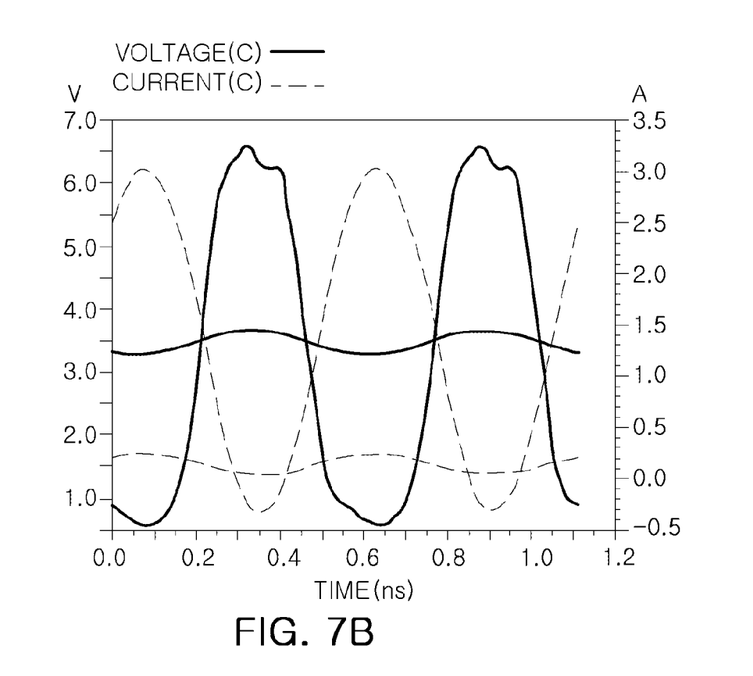

FIGS. 7A and 7B are graphs illustrating a transition of a voltage and a current of an amplifier over time in a power amplifier according to an embodiment.

Referring to FIGS. 6A through 7B, a horizontal axis of the graphs of FIGS. 6A and 7A denotes a time, and a vertical axis thereof denotes a voltage of point A and C of FIG. 2 when an input signal is at maximum and minimum power. A horizontal axis of the graphs of FIGS. 6B and 7B denotes a time, and a vertical axis thereof denotes a voltage and a current of a point C of FIG. 2 when an input signal is at maximum and minimum power.

Magnitudes and phase characteristics of a fundamental wave signal component and a secondary harmonic signal component of a power amplifier which does not include the delay transferring circuit may be seen from FIGS. 6A and 6B. It may be seen that a peak portion in a waveform of an output (voltage(C)) signal of the power amplifier is distorted. The above-mentioned distortion may occur by amplifying and delaying the harmonic signal component included in the signal.

Magnitudes and phase characteristics of a fundamental wave signal component and a secondary harmonic signal component of a power amplifier according to an embodiment may be seen from FIGS. 7A and 7B. It may be seen that the distortion of the peak portion in the waveform of the output (voltage(C)) signal of the power amplifier is improved. The above-mentioned distortion may be improved by correcting the phase of the harmonic signal component included in the signal or offsetting the harmonic signal component. In addition, it may be seen that the peak portion in the waveform of the output (voltage(C)) signal of the power amplifier is close to a square waveform when the input signal is at maximum power. This means that efficiency of the power amplifier is improved.

Figure 8A:
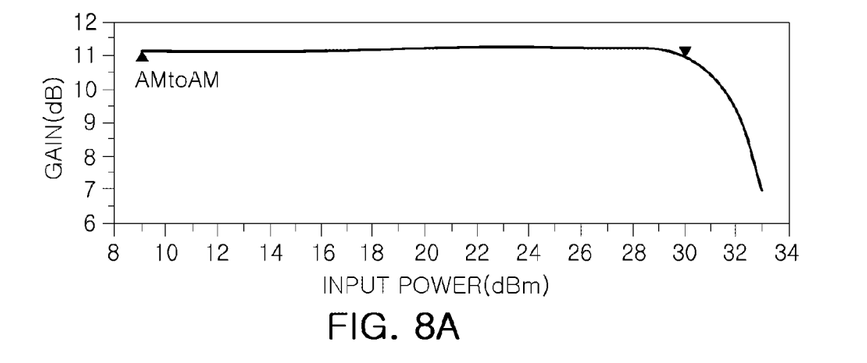
FIGS. 8A through 8C are graphs illustrating a voltage gain, a phase change, and efficiency according to input power in the power amplifier which does not include the delay transferring circuit.
Figure 8B:
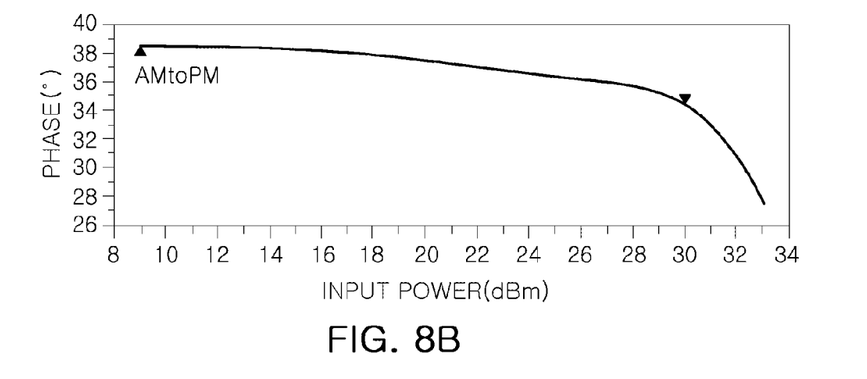
Figure 8C:
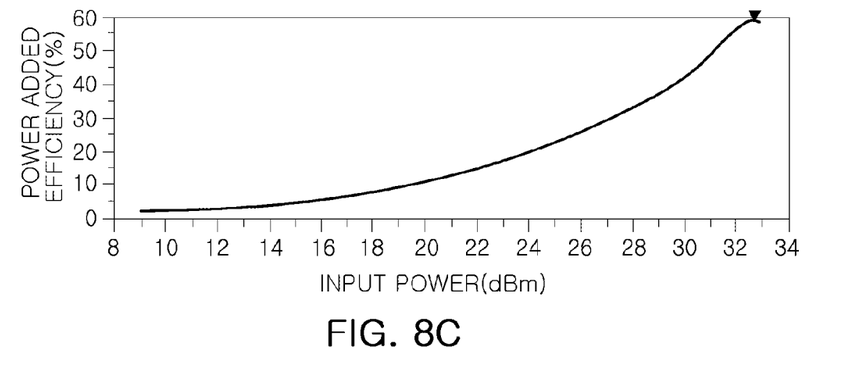

FIGS. 8A through 8C are graphs illustrating a voltage gain, a phase change, and power added efficiency according to input power in the power amplifier which does not include the delay transferring circuit.

Figure 9A:
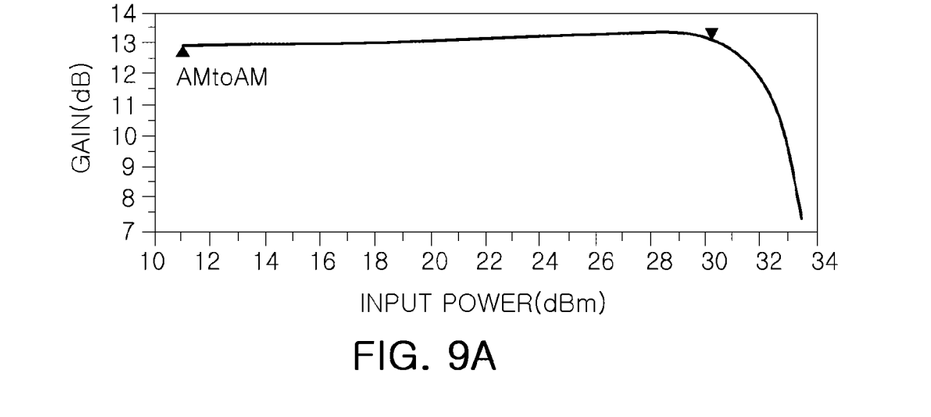
FIGS. 9A through 9C are graphs illustrating a voltage gain, a phase change, and power added efficiency according to input power in a power amplifier.
Figure 9B:
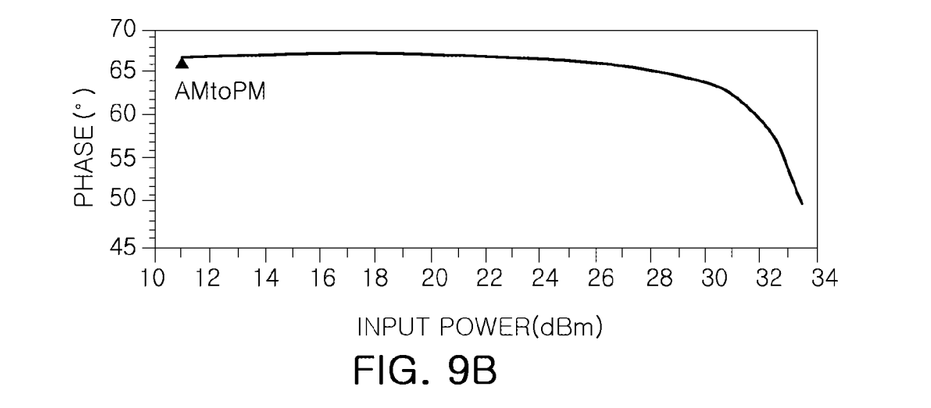
Figure 9C:
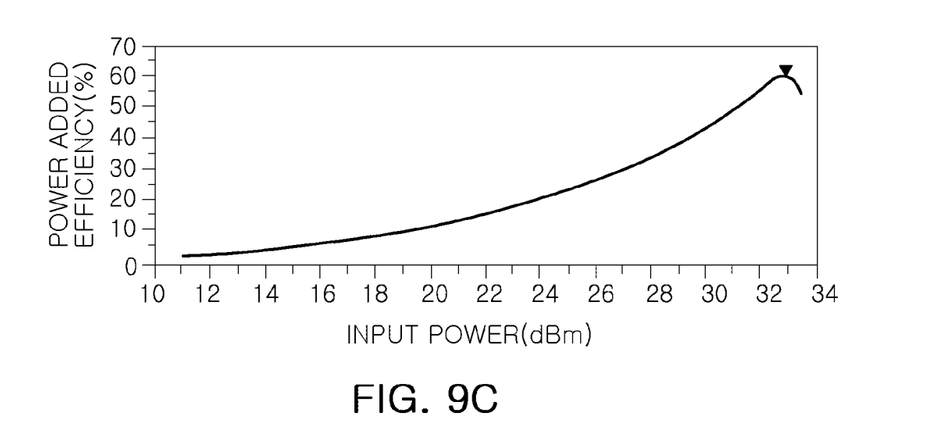

FIGS. 9A through 9C are graphs illustrating a voltage gain, a phase change, and power added efficiency according to input power in a power amplifier according to an embodiment.

Referring to FIGS. 8A through 9C, a horizontal axis of the graphs denotes input power, a vertical axis of the graphs of FIGS. 8A and 9A denotes a gain, a vertical axis of the graphs of FIGS. 8B and 9B denotes a phase, and a vertical axis of the graphs of FIGS. 8C and 9C denotes power added efficiency (PAE). Here, voltage gain characteristics of the power amplifier and amplitude change characteristics (AM to AM) up to a desired point of output power may be seen from the graphs of FIGS. 8A and 9A. Here, phase change characteristics (AM to PM Conversion) of the power amplifier according to an increase in input power may be seen from the graphs of FIGS. 8B and 9B.

It may be seen from FIGS. 8A through 8C that, in characteristics of the power amplifier which does not include the delay transferring circuit, maximum output power is 33 dBm, the phase change characteristics (AM to PM) is 4°, and the power added efficiency at the maximum output power is 48%.

It may be seen from FIGS. 9A through 9C that, in characteristics of the power amplifier according to the embodiment, maximum output power is 33 dBm, the phase change characteristics (AM to PM) is 3.1°, and the power added efficiency at the maximum output power is 51%.

Here, as the phase change characteristics are lower, a degree of phase distortion of the output signal may be low. In addition, as the power added efficiency at the maximum output power is higher, the efficiency of the power amplifier may be high. Therefore, the power amplifier according to the embodiment may simultaneously improve linear characteristics and efficiency characteristics.

Hereinafter, a phase correction method for a power amplifier according to an embodiment will be described. Since the phase correction method for a power amplifier is performed by the power amplifier 100 described above with reference to FIG. 1 or the power amplifier 200 described above with reference to FIG. 3, a description that is the same as or corresponds to the description described above will be omitted for conciseness and clarity.

Figure 10:
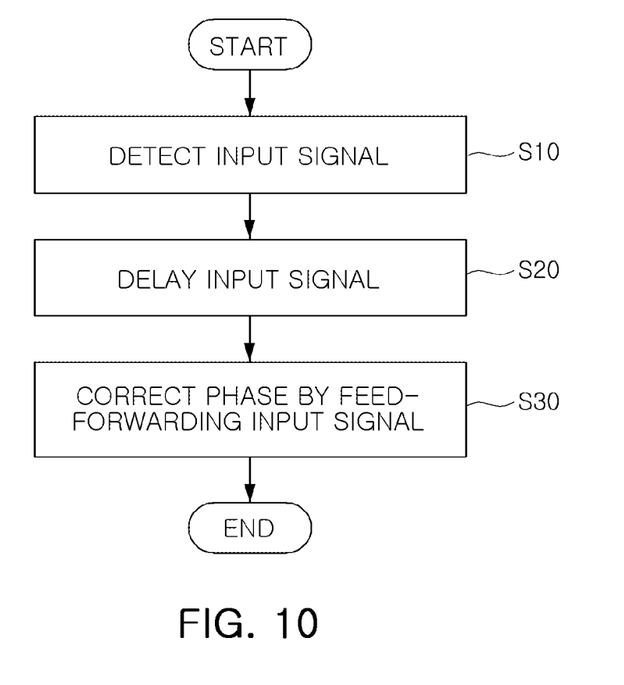
FIG. 10 is a flow chart illustrating a phase correction method for a power amplifier.

FIG. 10 is a flow chart illustrating a phase correction method for a power amplifier according to an embodiment.

Referring to FIG. 10, the phase correction method may include a signal detection operation (S10), a signal delaying operation (S20), and a phase correction operation (S30).

For example, the phase correction method may be performed by an internal control circuit of the power amplifier and may also be performed by an external control circuit.

In the signal detection operation (S10), the power amplifier may detect an input signal of the power amplifier. For example, the input signal may be detected by a transistor or a diode.

In the signal delaying operation (S20), the power amplifier may delay the input signal. For example, the input signal may be delayed by a resistor and a delay element.

For example, in the signal delaying operation (S20), the power amplifier may delay the input signal so that a time difference between a delay time of a fundamental wave component of the input signal and a delay time of a secondary harmonic component of the input signal is within a preset time range. Here, the preset time range may be varied depending on a frequency of the input signal, non-linearity characteristics of an amplifier, output impedance, or a degree of phase distortion.

In the phase correction operation (S30), the power amplifier may correct the phase by feed-forwarding the delayed input signal to an output terminal of the power amplifier.

As set forth above, according to the embodiments, the power amplifier may have linearity characteristics and efficiency characteristics improved simultaneously.

In addition, since the power amplifier may improve characteristics thereof by a configuration change, characteristics of the power amplifier associated with costs, complexity, a usage area, a degree of freedom of a design, utilization, and the like may be improved.

The apparatuses, units, modules, devices, and other components (e.g., the amplifier 110, delay transferring circuit 120, first matching network 130, second matching network 140, biasing circuit 150, and harmonic wave transferring circuit 220) that perform the operations described herein with respect to FIG. 10 are implemented by hardware components. Examples of hardware components include controllers, sensors, generators, drivers, transistors, diodes, logic, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIG. 10. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIG. 10 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier apparatus comprising:
   an amplifier configured to amplify an input signal received at an input terminal, and output an amplified signal from an output terminal; and
   a delay transferring circuit connected between the input terminal and the output terminal of the amplifier, the delay transferring circuit configured to delay the input signal and transfer the delayed input signal to the output terminal of the amplifier,
   wherein a harmonic component of the input signal is mixed with the amplified signal at the output terminal, via the delay transferring circuit, and the delay transferring circuit transfers the input signal substantially without amplification, and
   wherein the delay transferring circuit comprises a transistor having two terminals connected to the input terminal of the amplifier and one terminal connected to the output terminal of the amplifier to transfer the harmonic signal component of the input signal to the output terminal of the amplifier from the input terminal of the amplifier.

2. The power amplifier apparatus of claim 1, wherein the delay transferring circuit transfers the harmonic component of the input signal with a larger offset ratio than an offset ratio of a fundamental wave component of the input signal to the output terminal of the amplifier.

3. The power amplifier apparatus of claim 1, wherein the delay transferring circuit comprises a resistor connected between the input terminal and the output terminal of the amplifier and having a resistance level determined based on a delay component between the input terminal and the output terminal of the amplifier.

4. The power amplifier apparatus of claim 1, wherein the delay transferring circuit comprises a capacitor connected between the input terminal and the output terminal of the amplifier and having capacitance determined based on a resistance level between the input terminal and the output terminal of the amplifier.

5. A power amplifier apparatus comprising:
an amplifier configured to amplify an input signal received at an input terminal, and output an amplified signal from an output terminal;
a delay transferring circuit connected between the input terminal and the output terminal of the amplifier, the delay transferring circuit configured to delay the input signal and transfer the delayed input signal to the output terminal of the amplifier,
a first matching network matching impedance of the input terminal of the amplifier; and
a second matching network matching impedance of the output terminal of the amplifier,
wherein a harmonic component of the input signal is mixed with the amplified signal at the output terminal, via the delay transferring circuit, and the delay transferring circuit transfers the input signal substantially without amplification,
wherein the delay transferring circuit comprises a capacitor connected between the input terminal and the output terminal of the amplifier and having capacitance determined based on a resistance level between the input terminal and the output terminal of the amplifier, and
wherein the capacitance of the capacitor is adaptively established based on the impedance of at least one of the first matching network and the second matching network.

6. The power amplifier apparatus of claim 1, wherein the delay transferring circuit is configured to delay the input signal such that a time difference between a delay time of a fundamental wave component of the input signal is different from a delay time of a secondary harmonic component of the input signal.

7. A power amplifier apparatus comprising:
an amplifier configured to amplify an input signal received at an input terminal, and output an amplified signal from an output terminal; and
a harmonic wave transferring circuit connected between the input terminal and the output terminal of the amplifier and configured to transfer a harmonic component of the input signal to the output terminal of the amplifier,
wherein the harmonic component of the input signal is mixed with the amplified signal at the output terminal, and is transferred substantially without amplification, and
wherein the harmonic wave transferring circuit has impedance adaptively established such that a transfer ratio of a secondary harmonic wave of the input signal is higher than a transfer ratio of a fundamental wave of the input signal when the input signal is transferred to the output terminal of the amplifier.

8. The power amplifier apparatus of claim 7, further comprising: a diode connected between the input terminal and the output terminal of the amplifier and transferring the input signal of the amplifier to the output terminal from the input terminal of the amplifier.

9. A method for reducing distortion in an amplified signal comprising:
providing an input signal to an amplifier at an input terminal to generate an amplified signal at an output terminal;
adaptively generating interference between at least a portion of the amplified signal and at least a portion of the input signal to reduce distortion in an output signal that comprises at least a portion of both the input signal and the amplified signal,
wherein, substantially without amplification of the input signal, a harmonic component of the input signal is mixed with the amplified signal at the output terminal via a feedforward path, and
wherein at least one of the input signal and the amplified signal, or combinations thereof, are selectively delayed.

10. The method of claim 9, further comprising detecting an operational parameter of at least one of the input signal, the amplified signal, and the output signal.

11. The method of claim 10, wherein the adaptively generating interference is performed responsive to the detection of the operational parameter.

12. The method of claim 9, wherein the adaptively generating interference comprises delaying the input signal such that an offset ratio of a secondary harmonic component of the amplified signal is higher than an offset ratio of a fundamental wave component of the amplified signal.

13. The method of claim 9, wherein the adaptively generating interference comprises selectively mixing a harmonic signal component of the input signal with the amplified signal to form the output signal.

14. The method of claim 9, wherein the adaptively generating interference comprises delaying the input signal such that a time difference between a delay time of a fundamental wave component of the input signal is different from a delay time of a secondary harmonic component of the input signal.

15. The method of claim 9 wherein an impedance is adaptively established such that a transfer ratio of a secondary harmonic wave of the input signal is higher than a transfer ratio of a fundamental wave of the input signal when the input signal is mixed with the amplified signal to form the output signal.

16. The power amplifier apparatus of claim 1, wherein the transferred harmonic component of the input signal is mixed with the amplified signal in a constructive manner to reduce distortion of phase characteristics of the amplified signal.

17. The power amplifier apparatus of claim 7, wherein the transferred harmonic component of the input signal is mixed with the amplified signal in a constructive manner to reduce distortion of phase characteristics of the amplified signal.

* * * * *